United States Patent [19]
Konstantinov

[11] Patent Number: 6,005,261
[45] Date of Patent: Dec. 21, 1999

[54] SEMICONDUCTOR DEVICE WITH A JUNCTION TERMINATION AND A METHOD FOR PRODUCTION THEREOF

[75] Inventor: Andrey Konstantinov, Järfälla, Sweden

[73] Assignee: ABB Research Ltd., Zürich, Switzerland

[21] Appl. No.: 08/898,954

[22] Filed: Jul. 23, 1997

[30] Foreign Application Priority Data

Jun. 11, 1997 [SE] Sweden ................................. 9702220

[51] Int. Cl.⁶ ..................... H01L 31/0312; H01L 27/01; H01L 27/12; H01L 31/0392
[52] U.S. Cl. ............................................ 257/77; 257/347
[58] Field of Search ....................... 257/77, 347

[56] References Cited

U.S. PATENT DOCUMENTS

| | | | |
|---|---|---|---|
| 4,236,169 | 11/1980 | Nakashima et al. ................... | 357/39 |
| 4,918,497 | 4/1990 | Edmond . | |
| 5,061,972 | 10/1991 | Edmond . | |
| 5,313,092 | 5/1994 | Tsuruta et al. ....................... | 257/620 |
| 5,585,648 | 12/1996 | Tischler . | |

FOREIGN PATENT DOCUMENTS

| | | |
|---|---|---|
| 35 18 863 A1 | 11/1985 | Germany . |
| 36 32 489 A1 | 4/1987 | Germany . |
| 1 230 368 | 4/1971 | United Kingdom . |
| WO 90/07192 | 6/1990 | WIPO . |

OTHER PUBLICATIONS

P.A. Tove, *Methods of Avoiding Edge Effects on Semiconductor Diodes*, J. Physics D: Applied Physics, vol. 15 No. 4, pp. 517–536, Apr. 1992.

V.I. Sankin, D.P. Litvin and Yu.A. Vodakov, Physical and Practical Aspects of Electron Heating in Superlattice alpha–SiC; Amorphous and Crystalline Silicon Carbide III, edited by G.L. Harris, MG Spencer and C.Y–W. Yang, (Springer Proc. in Physics v. 56, Berlin 1992), pp. 225–229; proceedings of ICACSC–III, Apr. 1990.

D. Alok & B.J. Baliga, Argon Implanted SiC Device Edge Termination: Modelling, Analysis and Experimental Results: Silicon Carbide and Related Materials, edited by S. Nakashima, H. Matsunami, S. Yoshida & H. Harima, IOP Conf. Seroes vpl. 142, IOP, Bristol, 1996, pp. 565–568, Proceedings of ICSCRM–95, Sep., 1995.

*Primary Examiner*—Stephen D. Meier
*Attorney, Agent, or Firm*—Pollock, Vande Sande & Amernick

[57] ABSTRACT

A semiconductor device has a first low-doped semiconductor layer of SiC, a second layer placed next thereto and a junction between these layers being adapted to hold a voltage in a blocking state of the device with a substantially thicker depletion layer in the first layer than in the second one. A junction edge termination is obtained by a position beveling of the junction, so that the area of the device decreases away from the second layer at least in the first layer close to the junction within at least a part of the depletion layer in the first layer and away therefrom by a peripheral bevel surface. The first and second layers are formed by a hexagonal SiC crystal having the c-axis oriented substantially perpendicular to the junction.

9 Claims, 1 Drawing Sheet

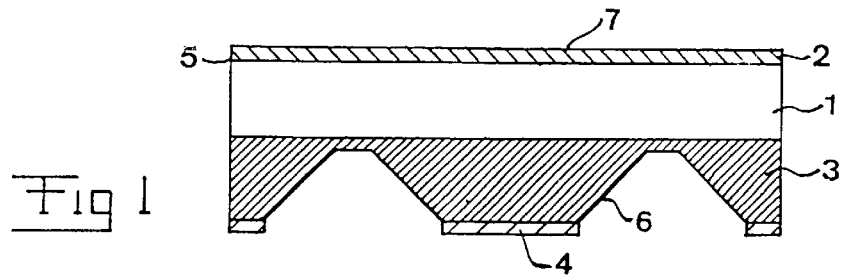
Fig 1
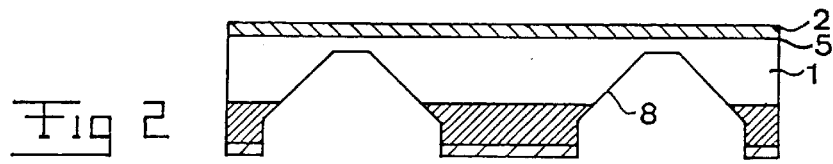
Fig 2
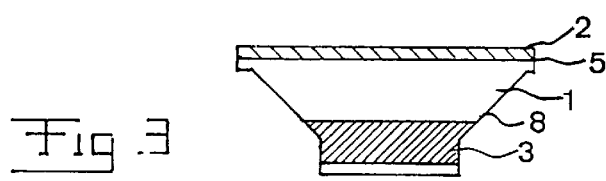
Fig 3
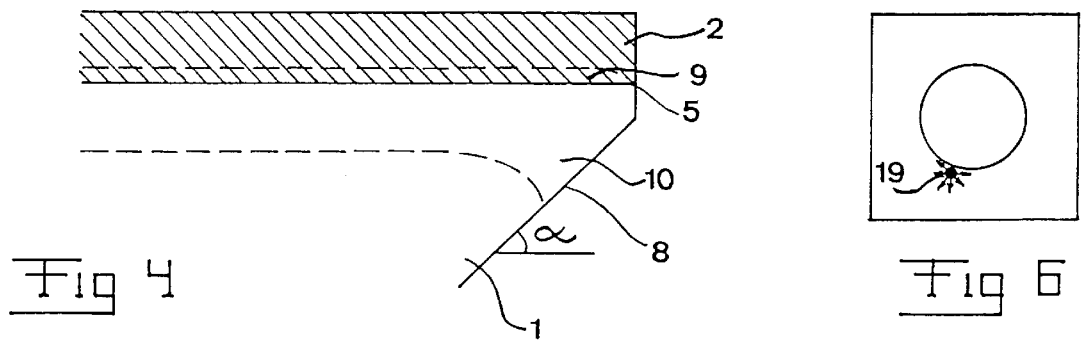
Fig 4
Fig 6
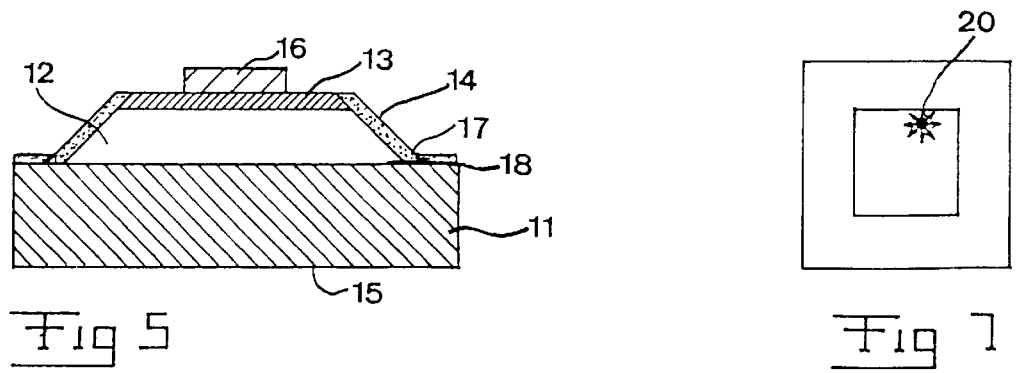
Fig 5
Fig 7

SEMICONDUCTOR DEVICE WITH A JUNCTION TERMINATION AND A METHOD FOR PRODUCTION THEREOF

TECHNICAL FIELD OF THE INVENTION

The present invention relates a semiconductor device having at least a first low doped semiconductor layer of SiC, a second layer placed on the first layer, a junction between these layers being adapted to hold a voltage in a blocking state of the device with a substantially thicker depletion layer in the first layer than in the second one, and means for terminating the edge of the junction for avoiding a peripheral breakdown thereof. This invention also relates to a method for producing such a semiconductor device.

The above includes all kinds of semiconductor devices having such a junction and in which at least one layer next to the junction is made of SiC the examples being pn diodes, Schottky diodes, bipolar and field-effect transistors.

BACKGROUND OF THE INVENTION

Such devices are particularly used in applications in which it is possible to benefit from the superior properties of SiC in comparison with especially Si, namely the capability of SiC to function well under extreme conditions. The present invention focuses on the ability of SiC to withstand more than five time higher fields in the blocking state of a device than Si, so that it is well suited as a material in high power devices operating under conditions where high voltages may occur in the blocking state of the device.

There are different means used until now for terminating silicon junction devices. Use of a certain type of termination technique is highly desirable otherwise the device will have a low breakdown voltage due to peripheral breakdown.

In properly designed high voltage semiconductor devices the breakdown always occurs via the avalanche mechanism, which implicates a sharp increase of reverse current as the field in the device or in a certain portion thereof. Ideally the breakdown should occur homogeneously over the entire device area because only in this case the maximum performance is obtained. If certain regions exist with a local increase of electric field, then the breakdown will always occur via those regions and at a lower voltage than can be obtained in a device with a uniform electric field. The ideal device with perfectly uniform electric field can never exist because such a device must be infinite, whereas real devices have a certain curvature of electric field at the device periphery. The field curvature is known to be a potential cause of early device breakdown and failure.

There are different means used until now for terminating silicon junction devices and different approaches to the device termination. The way to design the termination of a semiconductor device is to numerically simulate the distribution of electric filed near the device edge. The maximum field in the region of the electric field curvature must be as low as possible and, ideally, lower than the electric field in the central region, the bulk electric field. A number of termination techniques is known for silicon device termination based on the simulations. Those termination techniques are also known to work for cubic materials other than silicon, such as germanium or gallium arsenide.

When with silicon carbide an additional problem exists with a strong anisotropy of avalanche breakdown. The breakdown anisotropy means that the avalanche breakdown not only depends on the absolute value of the electric field, but also on the direction of the electric field. The implication of breakdown anisotropy is that the junction termination techniques developed for silicon will may not work for silicon carbide.

One known solution to this problem is to form device mesas with vertical walls by plasma etching and protect them with silicon dioxide. This can potentially eliminate the lateral field components in the device. However, this technique does not give stable results, presumably due to surface irregularities. Another known approach to this problem is to make a planar device and form a leaky resistive layer at the surface. This technique does not entirely eliminate lateral components of electric field, however, it minimizes them because the leaky layer greatly increases the extension of the depletion layer. A disadvantage of this technique is that the current through the leaky near-surface layer is rather high, resulting in unnecessary power losses and overheating of reverse-biased devices, particularly at high reverse bias.

SUMMARY OF THE INVENTION

The object of the present invention is to provide a semiconductor device of the type defined in the introduction having means for terminating the edge of the junction therefor for avoiding a peripheral breakdown thereof thus reducing the disadvantages of such devices already known. The present invention also relates to a method for producing such a device.

This object is according to the invention obtained by providing a device, in which such terminating means comprises a positive bevelling of the junction, so that the area of the device decreases away from the second layer at least in the first layer close to the junction within at least a part of the depletion layer in the first layer and away therefrom by a peripheral bevel surface. It has until now been assumed that the positive beveling technique may not be used for SiC due to the breakdown anisotropy in SiC. However, the present inventor has realized that this technique does also work for SiC, and it has turned out that the extension of the depletion layer in the low-doped first layer near the surface due to the area reduction causes a sufficient reduction in the electric field crowding for ensuring bulk breakdown prior to surface breakdown.

According to a preferred embodiment of the invention the first and second layers are formed by a hexagonal SiC crystal having the c-axis oriented substantially perpendicular to the junction. It has been found that the use of such an orientation of the junction will be possible and favorable in spite of the anisotropy problems. The breakdown field in the direction perpendicular to the c-plane, i.e. along the c-axis, has the highest value, so that the orientation of SiC devices within the (0001) crystal-plane (according to the c-axis) is preferential from the view point of voltage handling capabilities. On the other hand the edge effects for this configuration are much more dangerous than for devices with junction perpendicular to the c-plane, since in this case the electric field at the device periphery has components along which the breakdown is more easily achieved, i.e. will occur at lower voltages for a given doping and configuration. In practice this means that almost all of a reverse current will be concentrated in the narrow region at the device periphery and even a low reverse current inevitably results in a high current density. Such a device may therefore be destroyed by a very low reverse current, which is undesirable in power applications. However, it has been found that the use of the positive beveling technique may allow this desired orientation of the junction perpendicular to the c-axis for utilizing the maximum electric strength of the material, while still ensuring a breakdown in the bulk prior to peripheral breakdown, which may not be tolerated in SiC as sometimes for Si devices, in which the critical field is approximately an order of magnitude lower than for SiC.

According to another preferred embodiment of the invention bevel surface makes an angle to junction being smaller than 70°. It has been found that the effect of the positive beveling technique used on SiC is working much better when the angle is smaller than 70° than thereabove, which is quite different for Si, in which the positive angle beveling works already at a 90° angle. Thus, it might have been expected that this technique would not work at all for SiC, since it does not work well for large angles for which it works for Si, but it has turned out that a suitable use of smaller angles gives very good results avoiding peripheral breakdown.

According to a preferred embodiment of the invention the angle is smaller than 60°, and according to a still further preferred embodiment of the invention the angle is approximately 45° or lower. Such small angles are preferable as being safer from peripheral breakdown than larger angles.

The object of the present invention is also obtained by providing a method according to the introduction, which is characterized in that starting from a wafer having at least the two layers on top of each other material is removed from at least the first layer around a central portion thereof so that a peripheral bevel surface is formed therearound, so that the area of the device decreases away from the second layer at least in the first layer close to the junction within at least a part of the depletion layer in the first layer and away therefrom.

Semiconductor devices having at least one layer of SiC next to the junction, for which peripheral breakdown is avoided, may be produced in this way.

According to a preferred embodiment of the invention it is started from a wafer having at least a third highly doped layer of SiC on the opposite side of the first layer with respect to the second layer and being of the same conductivity type as the first layer, the material removal being carried out in the direction from the third towards the second layer. The material removal is started by a first step of chemical etching or mechanical grinding or polishing forming a peripheral bevel surface extending at least through a part of the third layer followed by a second step of plasma etching extending the peripheral bevel surface to at least close to the junction and within the depletion layer in the first layer in the blocking state of the device so produced. It is preferred to combine these two steps, since the removal according to the first step may be carried out at a comparatively high rate making it commercially interesting, but it would be necessary to follow up by the second step of plasma etching for removing the regions with residual mechanical damage in the case of mechanical grinding or polishing in the first step and making it possible to apply contact metallization before separating a wafer in individual devices in conjunction with completing the formation of the bevel surface, since plasma etching is compatible with contact metallization, but chemical etching is not, in the case of chemical etching in the first step.

Further advantages as well as preferred features of the invention will appear from the following description and the other dependent claims.

BRIEF DESCRIPTION OF THE DRAWINGS

With reference to the appended drawings, below follows a specific description of preferred embodiments of the invention cited as examples.

In the drawings:

FIGS. 1–3 schematically illustrate three different steps for producing a pn diode having a junction termination obtained by the positive angle beveling technique according to the invention, FIG. 4 is an enlarged view of the edge region close to the junction of the device according to FIG. 3, FIG. 5 is a device according to another preferred embodiment of the invention, and FIGS. 6 and 7 are two images illustrating where electrical breakdown appears in a SiC pn diode having a bevel surface at an angle of 85° and 45°, respectively.

DETAILED DESCRIPTION OF PREFERRED EMBODIMENTS OF THE INVENTION

FIGS. 1–3 illustrate a few important steps of a larger number of steps of a method according to the invention for producing a power diode made of SiC. FIG. 1 illustrates how it is started from a wafer having a first low-doped n-type drift layer 1, a thin second p-type highly doped base layer 2 on top of the first layer and a comparatively thick n-type highly doped substrate layer 3 placed on the opposite side of the drift layer 1 with respect to the base layer 2. A junction 5 adapted to hold a voltage when the pn diode to be produced from this wafer is in the reverse-biased state is located between the first layer 1 and the second layer 2. As already mentioned, it is preferred that a hexagonal SiC crystal having the c-axis oriented substantially perpendicular to the junction 5 is used for obtaining a maximum electric strength of the device. It is preferred that the thickness of the p-type layer 2 is as low as possible because p-type SiC has much higher resistance than n-type regions of comparable doping. Low doping concentrations may be in the order of $10^{15}$–$10^{17}$ cm$^{-3}$, while high doping concentrations are in the order of $10^{19}$–$5\times10^{20}$ cm$^{-3}$.

Starting from such a wafer chemical etching or mechanical grinding or polishing is carried out from the wafer surface opposite to the second layer for forming a sloping surface 6 making an angle of approximately 45° with the surface 7 of the wafer. This angle is immediately obtained when chemical etching is used. Chemical etching is in fact the best technique to form a good surface and configuration. However, this technique is incompatible with contact metallization, so that the metal contacts 4 illustrated in FIG. 1 must be formed afterwards. When the bevel surfaces of the devices are formed, these are separated into individual devices, and such individual devices are very difficult to process further on, so depositing and patterning the metal contacts will turn into a problem if one uses only chemical etching. This is the reason for not using chemical etching for the entire wafer. The bevel surface 6 may also be formed by mechanical grinding or polishing, which is a good technique to form sloping walls, however, this technique must be followed by chemical or plasma etching so as to remove the regions with residual mechanical damage.

Accordingly, it is preferred after the first step to complete the formation of the bevel surface 8 by a step of plasma etching illustrated in FIG. 2. This step of plasma etching is carried out at least close to the junction 7. The contact metallization 4 has preferably been applied after the first step. Plasma etching is compatible with contact metallization and many metals have a very low etching rate in plasma. After that, it is etched from the top, as illustrated in FIG. 3 for device separation. Although, it is not illustrated in the figures, the wafer will in practice be much larger, so that a number of devices will in this way be produced from one and the same wafer in the way described.

It is schematically illustrated in FIG. 4 what the depletion regions 9 and 10 in the second p-type layer and the first n-type layer indicated by dashed lines will look like at the edge of the device according to FIG. 3 in the reverse-biased state of such a pn diode. It is illustrated that the thickness of the depletion region in the low-doped n-type layer is greater than in the bulk resulting in lowering of the electric field at the edge. This is because of the requirement to maintain the charge balance on the opposites sides of the junction, which means that the depletion layer on the lightly doped side of the junction is forced to expand near the surface. It has been found that when the angle α is smaller than 70° provision of such a bevel surface 8 will ensure bulk breakdown prior to peripheral breakdown also if the c-axis of a hexagonal SiC crystal used is oriented substantially perpendicular to the junction, which is preferred due to a maximum bulk breakdown field of the device.

A device according to a second preferred embodiment of the invention is illustrated in FIG. 5. This device has been manufactured by a method corresponding to that illustrated in FIGS. 1–3, but it has an inverted design, in that the substrate layer is a highly doped p-type layer 11, on top of which a low-doped n-type drift layer 12 and a highly doped n-type contact layer 13 are epitaxially grown. It is illustrated how the junction is terminated by the bevel surface 14 making an angle of approximately 45° with respect to the surface 15 of the device. Designated as 16 is a metal contact and 17 is an insulating layer applied on the bevel surface across the junction 18 for passivation thereof. This insulation layer 17 is preferably of $SiO_2$.

A device according to FIG. 5 was produced for a bevel angle of about 85° and about 45°. Plasma etching was used to obtain the devices with the bevel angle of 85°, whereas 45° mesas were obtained by chemical etching.

The breakdown voltages depended on the base thickness and doping and were in the range 200–700 V. All the devices with the mesa angle of 85° have irreversible degradation of characteristics at a reverse current of about 10–50 $\mu A$. Investigation of the diodes showed a damaged region at the device periphery. Investigation of reverse-biased pn diodes at low currents of about 1–3 $\mu A$ using a high sensitivity imaging camera (see FIG. 6) has shown localized spots 19 of light emission due to hot carriers produced by electrical breakdown. These spots were at the diode periphery as seen from the typical image shown in FIG. 6. The emitted light is superimposed on the image so as to show the location of the spot with respect to the device mesa. The diodes with a lower mesa angle of about 45° were entirely free from the peripheral breakdown. It was possible to drive high reverse currents of up to 30 mA (at voltages of 400–500 V) in the DC mode and yet higher currents in a pulsed mode. Investigation of images of the breakdown luminescence showed no emission from the diode edge. After removal of the contact metallization hot-carrier light emission from the bulk of the diodes was observed. For some diodes it was perfectly homogeneous, other diodes showed some brighter spots 20, presumably associated with crystal imperfections, as seen in FIG. 7. However, no irreversible degradation was associated with imperfections for most of the diodes. No early breakdown is seen even at the device corners. This is a great improvement as compared to the early failure of 85° devices with the more favorable circular configuration as illustrated in FIG. 6.

The diodes tested according to above had an off-orientation from the (0001) crystal plane of 3,5° and 8°. This off-orientation was used to facilitate epitaxial growth and was found to have no effect on terminations.

It has been found that it is enough for ensuring a safe junction termination that the bevel angle is below 70° for SiC of the 4H polytype, below 60° for the 6H polytype and below 45° where the crystal is off-oriented from the (0001) plane within 10°.

The invention is of course not in any way restricted to the embodiments described above, but several possibilities of modifications thereof would be apparent to a man skilled in the art without departing from the basic idea of the invention as defined in the claims.

The second layer may just as well be a layer of a material other than SiC, such as a metal layer in the case of a device in which the junction is a Schottky junction.

All definitions concerning the material of the different layers of course also include inevitable impurities as well as intentional doping when SiC is concerned.

I claim:

1. A semiconductor device comprising at least a first low-doped semiconductor layer of SiC, a second layer placed thereon, a junction between said first and second layers adapted to hold a voltage in a blocking state of the device with a substantially thicker depletion layer in said first layer than in said second layer, and means for terminating the edge of the junction for avoiding a peripheral breakdown thereof, said terminating means comprising a positive bevelling of the junction, so that the area of the device decreases away from said second layer at least in said first layer close to said junction within at least a part of the depletion layer in said first layer and away therefrom by a peripheral bevel surface, said first and second layers being formed by a hexagonal SiC crystal having the c-axis oriented substantially perpendicular to said junction.

2. A device according to claim 1, wherein said peripheral bevel surface makes an angle with said junction which is smaller than 70°.

3. A device according to claim 2, wherein said angle is smaller than 60°.

4. A device according to claim 2, wherein said angle is approximately 45° or smaller.

5. A device according to claim 1, wherein said junction is a Schottky junction and said second layer is a metal layer.

6. A device according to claim 1, wherein said junction is a pn junction and said second layer is a highly doped layer of SiC.

7. A device according to claim 6, wherein said device is a rectifying diode.

8. A device according to claim 1, wherein said first layer is of an n-type and is thick with respect to said second layer.

9. A device according to claim 1, wherein said terminating means further comprises an insulating layer applied on the peripheral surface of the device across said junction.

* * * * *